United States Patent [19]
Song

[11] Patent Number: 5,812,449
[45] Date of Patent: Sep. 22, 1998

[54] FLASH EEPROM CELL, METHOD OF MANUFACTURING THE SAME, METHOD OF PROGRAMMING AND METHOD OF READING THE SAME

[75] Inventor: Bok Nam Song, Ichon, Rep. of Korea

[73] Assignee: Hyundai Electronics Industries Co., Ltd., Kyungki-Do, Rep. of Korea

[21] Appl. No.: 644,211

[22] Filed: May 10, 1996

[30] Foreign Application Priority Data

May 16, 1995 [KR] Rep. of Korea ........................ 95-12040

[51] Int. Cl.$^6$ ................................................. G11C 11/34
[52] U.S. Cl. ................................ 365/185.03; 365/185.18
[58] Field of Search ......................... 365/185.03, 185.14, 365/185.18

[56] References Cited

U.S. PATENT DOCUMENTS

| | | | |
|---|---|---|---|
| 5,021,999 | 6/1991 | Kohda et al. | 365/185.03 |
| 5,159,570 | 10/1992 | Mitchell et al. | 365/185.03 |
| 5,168,465 | 12/1992 | Harari | 365/185.03 |
| 5,189,497 | 2/1993 | Komori et al. | 357/23.5 |
| 5,652,719 | 7/1997 | Tanaka et al. | 365/185.03 |

*Primary Examiner*—A. Zarabia
*Attorney, Agent, or Firm*—Cohen, Pontani, Lieberman, Pavane

[57] ABSTRACT

The present invention relates to a flash EEPROM cell, method of manufacturing the same, and method of programming and reading the same and, more particularly, to a flash EEPROM cell constructed in such a way that two floating gates are formed on top of a channel region to implement a memory cell to, and from, which 4-numeration information can be programmed and read out, and an output of 4-numeration information is obtained depending on the programming or erasing of each of the two floating gates.

2 Claims, 5 Drawing Sheets

FLASH EEPROM CELL, METHOD OF MANUFACTURING THE SAME, METHOD OF PROGRAMMING AND METHOD OF READING THE SAME

BACKGROUND OF INVENTION

Field of the Invention

The present invention relates to a flash EEPROM cell, a method of manufacturing the same, and a method of programming and reading the same and, more particularly, to a flash EEPROM cell constructed in such a way that two floating gates are formed on top of a channel region and an output of 4-numeration information is obtained depending on the program or erasure of each of the two floating gates.

INFORMATION DISCLOSURE STATEMENT

In general, the demand for electrically erasable programmable read only memory(EEPROM) device having both the functions of electrically programming and erasing is increasing due to its inherent advantages. Since this EEPROM device programs or erases only binary information, that is, "0" or "1", in one cell, the amount of information that can be presented by one byte (eight (8) cells) is $256(=2^8)$. However, if a cell has 4-numeration information, that is, "0","1","2" or "3", the amount of information of one byte is $65,536 (=4^8)$. The amount of information is 256 times more than that of a binary cell. Therefore, it is possible to implement a memory device having a capacity of more than one gigabit.

SUMMARY OF THE INVENTION

Therefore, the object of the present invention is to provide a flash EEPROM cell which can solve the above disadvantage by implementing a flash EEPROM device constructed in such a way that two floating gates are formed on top of a channel region and a storage and output of 4-numeration information is obtained depending on the program or erasure of each of the two floating gates.

A flash EEPROM cell, according to the present invention to accomplish the above described object, is characterized in that it comprises first and second floating gates horizontally adjacent to each other and electrically separated from a silicon substrate below them by a tunnel oxide film; a dielectric film formed on the top surface including said first and second floating gates; a control gate formed on top of said dielectric film and electrically separated from said first and second floating gates by said dielectric film; and a source and drain formed on said silicon substrate and formed to be partially overlapped by outer portions of said first and second floating gates, respectively.

A method of manufacturing a flash EEPROM cell of a first embodiment is characterized in that it comprises the steps of sequentially forming a tunnel oxide film and a first polysilicon layer on a silicon substrate; forming each of the first and second floating gates by patterning said first polysilicon layer; forming a source and drain by implanting impurity ions into the entire region of said silicon substrate excluding said region between said first and second floating gates; sequentially forming a dielectric film and second polysilicon layer on the entire top surface; and forming a control gate by sequentially patterning said second polysilicon layer and dielectric film.

A method of manufacturing a flash EEPROM cell of a second embodiment is characterized in that it comprises the steps of sequentially forming a tunnel oxide film and first polysilicon layer on a silicon substrate; patterning said first polysilicon between a first floating gate and second floating gate; sequentially forming a dielectric film and a second polysilicon layer on the entire top surface; sequentially patterning said second polysilicon layer, dielectric film and first and second floating gates by a photolithography and etching process utilizing a mask for a control gate electrode; and forming a source and drain by implementing impurity ions into said silicon substrate.

A method of programming a flash EEPROM cell is characterized in that 4-numeration information is programmed by applying bias voltage to a control gate, source and drain so that hot electrons are injected into the first and second floating gates and, thereafter, by selectively erasing said hot electrons injected into said first and second floating gates depending on the condition of bias voltage applied to said control gate, source and drain.

A method of reading a flash EEPROM cell is characterized in that stored information is read depending upon existence of drain and source current after performing a forward read and reverse read to read out 4-numeration information programmed by hot electrons injected selectively into the first and second floating gates.

BRIEF DESCRIPTION OF THE DRAWINGS

For fuller understanding of the nature and object of the invention, reference should be had to the following detailed description taken in conjunction with the accompanying drawings in which.

Similar reference characters refer to similar parts in the several views of the drawings.

DETAILED DESCRIPTION OF THE INVENTION

FIGS. 1A through 1E are sectional to illustrate a method of manufacturing a first embodiment of a flash EEPROM cell according to the present invention.

Figure 1A:
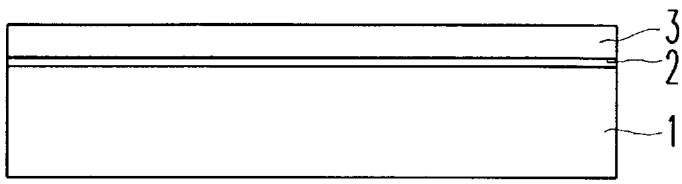
FIGS. 1A through 1E are sectional views to illustrate a method of manufacturing a first embodiment of a flash EEPROM cell according to the present invention.

FIG. 1A is a sectional view showing a condition in which a tunnel oxide film 2 is formed to a thickness of 80 to 120 Å on a silicon substrate 1, and thereafter, a first polysilicon layer 3 is formed.

Figure 1B:
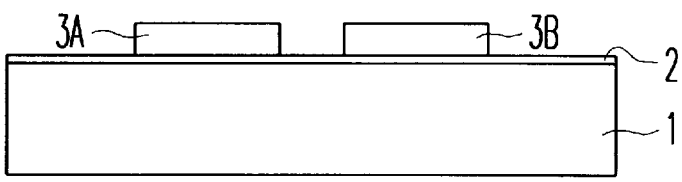

FIG. 1B is a sectional view showing a condition in which the first and second floating gates 3A, 3B, horizontally adjoining are formed by patterning the first polysilicon layer 3 by a photolithography and etching process utilizing a mask (not shown) for a floating gate electrode.

Figure 1C:
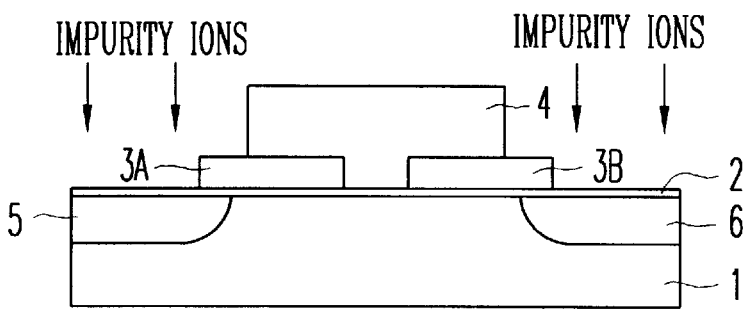

FIG. 1C is a sectional view showing a condition in which a source and drain 5, 6 are formed by coating a photoresist 4 on the entire surface, thereafter, patterning the photoresist 4 so that the photoresist 4 remains on top and between the first and second floating gates 3A, 3B and implanting impurity ions into the exposed silicon substrate 1.

Figure 1D:
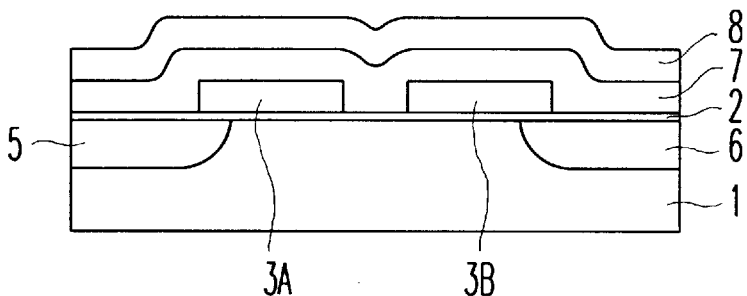

FIG. 1D is a sectional view showing a condition in which a dielectric film 7 and second polysilicon layer 8 are sequentially formed on the entire top surface. The dielectric film 7 has an ONO construction in which an oxide film, nitride film and oxide film are sequentially formed.

Figure 1E:
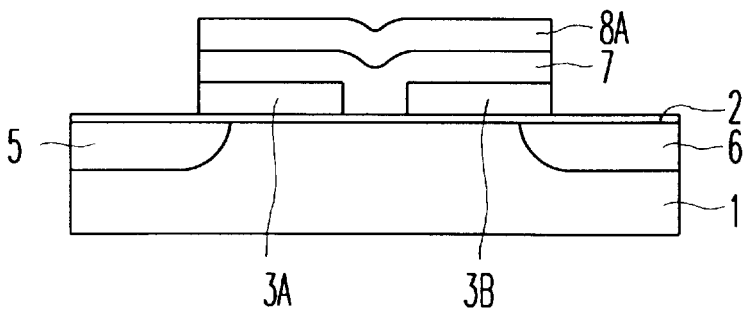

FIG. 1E is a sectional view showing a condition for the formation of an EEPROM cell in which the dielectric film 7 and a control gate 8A are formed on the first and second floating gates 3A, 3B by sequentially etching the second polysilicon layer 8 and the dielectric film 7 by the photolithography and etching process utilizing a mask (not shown) for a control gate electrode.

FIGS. 2A through 2D are sectional to illustrate a method of manufacturing a second embodiment of a flash EEPROM cell according to the present invention.

Figure 2A:
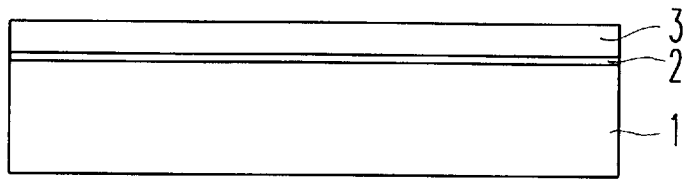
FIGS. 2A through 2D are sectional views to illustrate a method of manufacturing a second embodiment of the flash EEPROM cell according to the present invention.

FIG. 2A is a sectional view showing a condition in which a tunnel oxide film 2 is formed to a thickness of 80 to 120 Å on a silicon substrate 1, and thereafter, a first polysilicon layer 3 is formed.

Figure 2B:
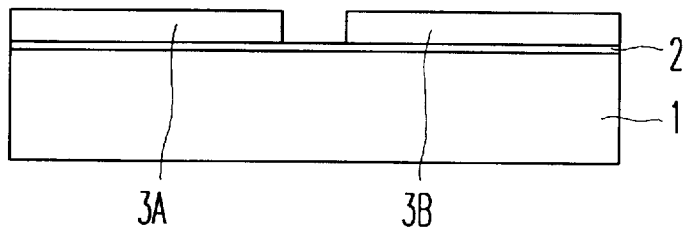

FIG. 2B is a sectional view showing a condition in which the first polysilicon layer 3 between the first and second floating gates 3A, 3B is patterned by the photolithography and etching process.

Figure 2C:
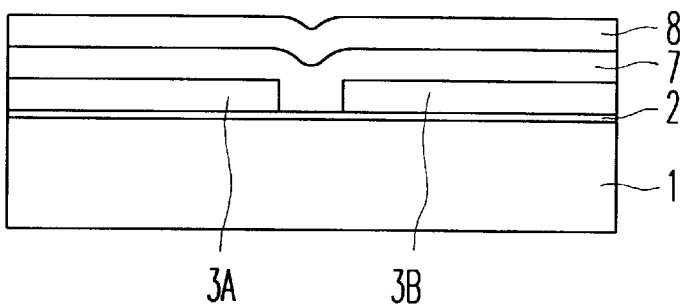

FIG. 2C is a sectional view showing a condition in which a dielectric film 7 and second polysilicon layer 8 are sequentially formed on the entire top surface. The dielectric film 7 has an ONO construction in which an oxide film, nitride film and oxide film are sequentially formed.

Figure 2D:
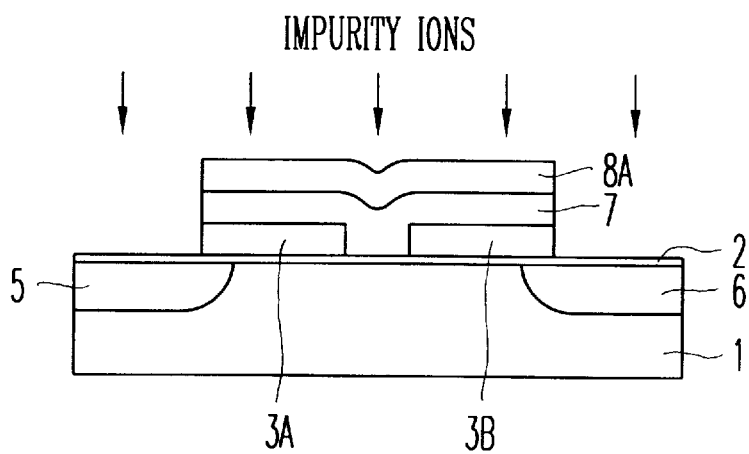

FIG. 2D is a sectional view showing a condition for the formation of an EEPROM cell in which the dielectric film 7 and a control gate 8A are formed on the fist and second floating gates 3A, 3B by sequentially etching the second polysilicon layer 8, dielectric film 7, and the first and second floating gates 3A, 3B by the photolithography and etching process utilizing a mask (not shown) for a control gate electrode, and by forming a source and drain 5, 6 by implanting impurity ions into the silicon substrate 1.

The flow of current at the time of reading out becomes easy by the effective channel length and effective securing of the required area at the time of tunnelling by forming, as described above, two floating gates 3A, 3B to be horizontally adjoining on the tunnel oxide film 2, which is formed thick so as to enable the tunnelling, and by forming the source and drain 5, 6 on the silicon substrate 1 to sufficiently overlap each outer part of the two floating gates 3A, 3B.

Operations of the flash EEPROM cell, manufactured as described above, for programming and reading out the 4-numeration information ("0","1", "2" or "3"), by utilizing such technological principles, are explained below.

FIGS. 3A through 3D are sectional views showing an operation condition to illustrate the programming operation of the flash EEPROM cell according to the present invention, and the operational condition is given as follows with reference to FIGS. 4A through 4D.

Figure 3A:
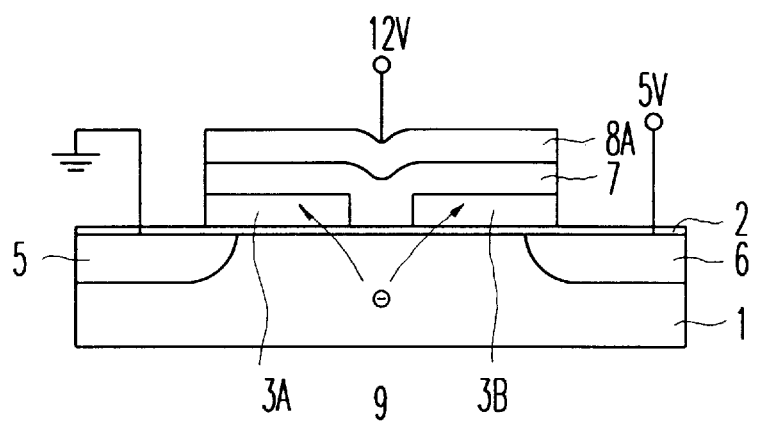
FIGS. 3A through 3D are drawings to illustrate an operation of programming the flash EEPROM cell according to the present invention.

First, to program an information "0" into the cell, that is, to charge all the floating gates, a high voltage of 12 volts is applied to the control gate 8A, 5 volts is applied to the drain 6, and a ground potential is applied to the source 5, as shown in FIG. 3A. Then, a channel is formed in the silicon substrate 1 below the first and second floating gates 3A, 3B by the high potential applied to the control gate 8A, and a high electric field region is formed in the silicon substrate 1 between the first and second floating gates 3A, 3B by the voltage applied to the drain 6. At this time, hot electrons 9 are generated by current passing through the high electric field region and a portion of the hot electrons 9 are injected into the first and second floating gates 3A, 3B by a vertical electric field formed by the high potential applied to the control gate 8A. Since the threshold voltage of the drain and source 6, 5 is raised to, for example, about 6 volts, the information "0" is programmed, as shown in FIG. 4A.

Figure 3B:
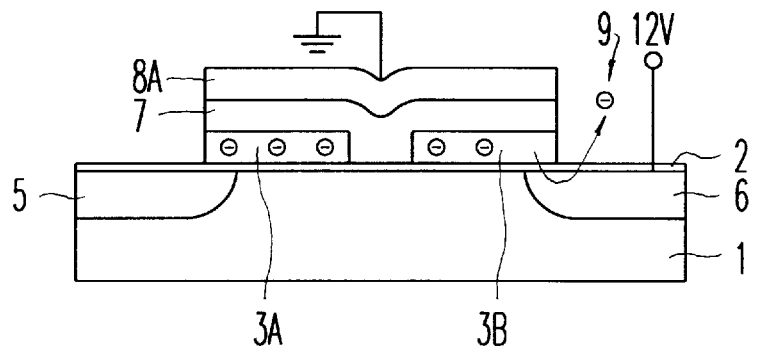
Figure 4A:
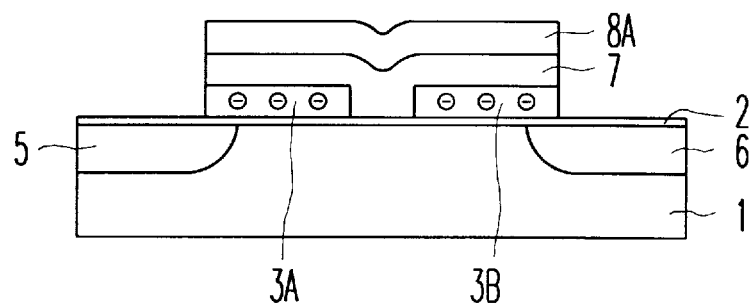
FIGS. 4A through 4D are drawings to illustrate the concept of FIGS. 3A through 3D.
Figure 4B:
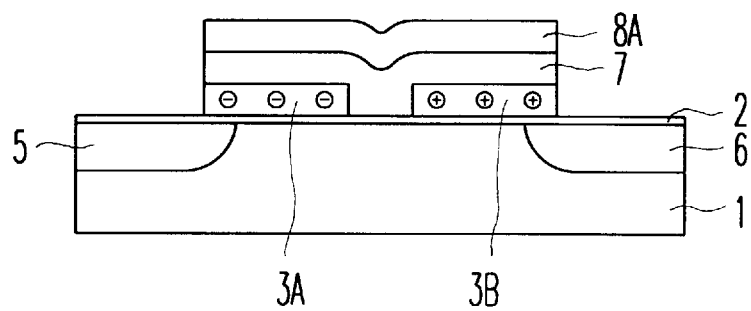

To program an information "1" into the cell, if the ground potential is applied to the control gate 8A, 12 volts are applied to the drain 6 and the source 5 is floated, as shown in FIG. 3B in the condition shown in FIG. 4A, then the electrons 9 charged in the second floating gate 3B are discharged through the drain 6 by the tunnelling, whereby the threshold voltage of the drain 6 is lowered to, for example, about 2 volts, so that the information "1" is programmed, as shown in FIG. 4B.

Figure 3C:
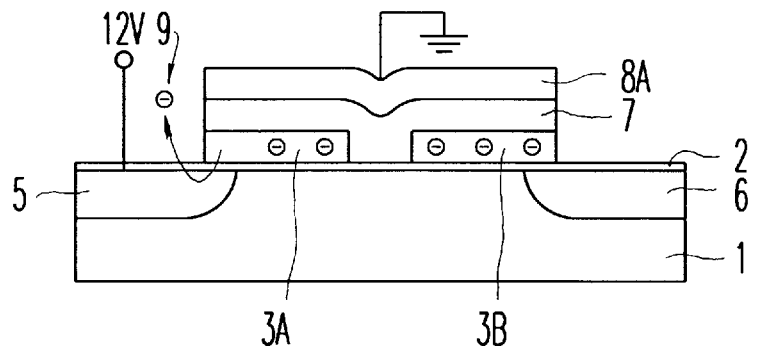
Figure 3D:
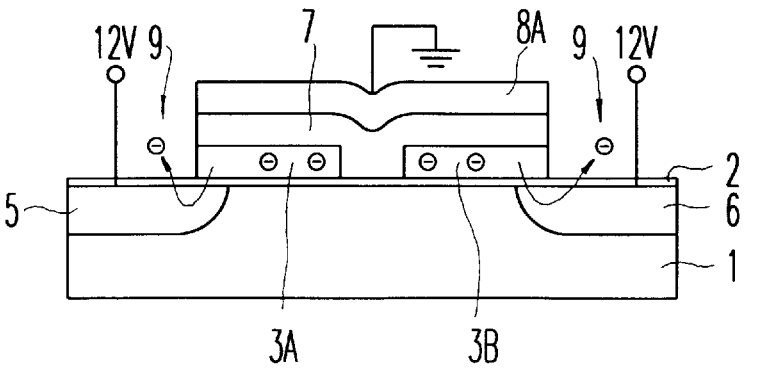
Figure 4C:
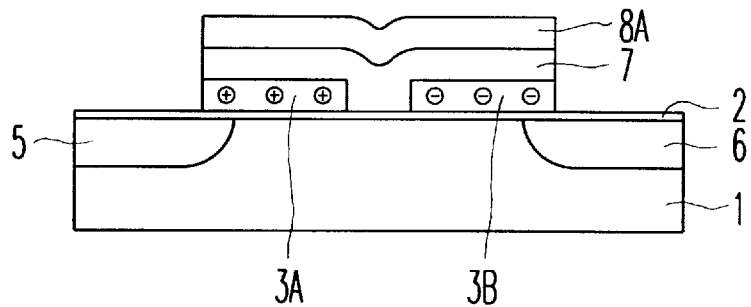

To program an information "2" into the cell, if the ground potential is applied to the control gate 8A, 12 volts are applied to the source 5 and the drain 6 is floated, as shown in FIG. 3C in the condition shown in FIG. 4A, then the electrons 9 charged in the second floating gate 3A are discharged through the source 5 by the tunnelling, whereby the threshold voltage of the source 5 is lowered to, for example, about 2 volts, so that the information "2" is programmed, as shown in FIG. 4C.

Figure 4D:
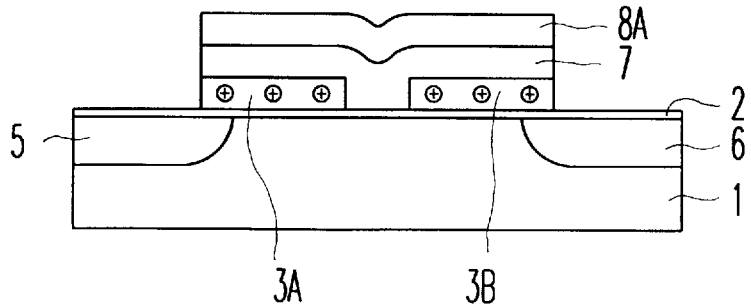

To program an information "3" into the cell, if the ground potential is applied to the control gate 8A, and 12 volts are applied to the source and drain 5, 6, then the electrons 9 charged in the first and second floating gates 3A, 3B are discharged through the source and drain 5, 6, respectively, so that the threshold voltage of the source and drain 5, 6 is lowered to, for example, about 2 volts, so that the information "3" is programmed, as shown in FIG. 4D.

As described above, the 4-numeration information can be programmed to a cell by changing the condition of the bias voltage applied to the control gate 8A, source and drain 5, 6, wherein, to prevent interaction between the two floating gates at the time of programming an information, the information "1 ", "2" or "3" is programmed after programming the information "0".

Now, a read operation for reading out the 4-numeration information programmed in the cell, as described above, is explained with reference to FIGS. 5A and 5B.

Since the 4-numeration information is programmed in one cell, as described above, basically two read operations, that is, forward read and reverse read shall be performed to read out the information. Here, a read operation, for example, in the condition where the information "2" is programmed, as shown in FIG. 4C, is explained.

Figure 5A:
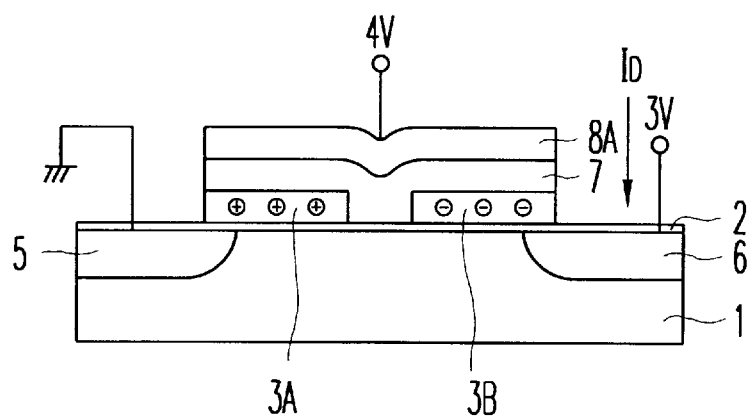
FIGS. 5A and 5B are drawings to illustrate an operation of reading the flash EEPROM cell according to the present invention.
Figure 5B:
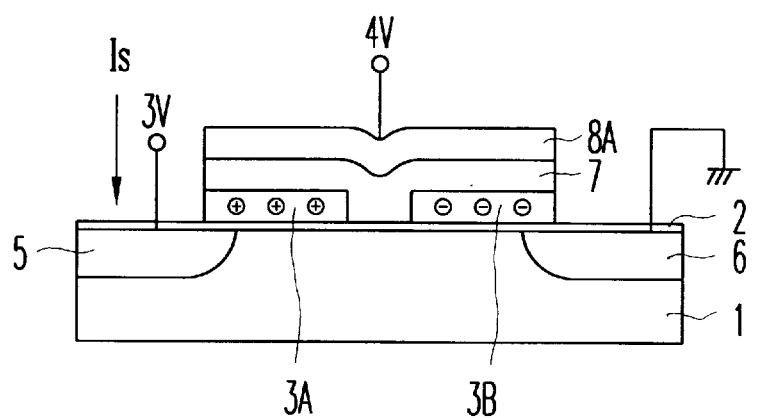

To perform the forward read in the condition where the electrons 9 are charged only in the second floating gate 3B, as shown in FIG. 4C, 4 volts are applied to the control gate 8A, 3 volts to the drain 6 and ground potential to the source 5, respectively, as shown in FIG. 5A. Then, a drain current, $I_D$ exists since a channel is formed in the silicon substrate 1 below the first floating gate 3A on the side of the source 5 into which the electrons 9 are injected. Also, to perform the reverse read in the condition where the electrons 9 are charged only in the second floating gate 3B, as shown in FIG. 4C, 4 volts are applied to the control gate 8A, 3 volts to the source 5 and ground potential to the drain 6, respectively, as shown in FIG. 5B. At this time, a source current, $I_S$, does not exist since a channel is not formed in the silicon substrate 1 below the second floating gate 3B on the side of the drain 6 into which the electrons 9 are injected. In this way, the stored information is read out depending on the existence of the drain or source current ($I_D$ or $I_S$) after the two read operations are performed. For reference, the condition of flow of drain and source Current at the time of reading out the above described Information,"0", "1", "2" or "3", is shown in a table follow.

| Information stored in a cell | Drain current($I_D$) at the time of forward read | Source current ($I_s$) at the time of reverse read |
|---|---|---|
| 0 | None | None |
| 1 | None | Flow |
| 2 | Flow | None |
| 3 | Flow | Flow |

As described above, according to the present invention, since the 4-numeration information can be programmed depending on the program or erasure of each of the two floating gates and the accurate reading of the information is possible by forming two floating gates on top of a channel region, the present invention can be utilized in embodying a flash EEPROM cell of large capacitance. Furthermore, since the information is stored in the floating gate, there is an excellent effect that the information can be permanently stored.

The foregoing description, although described in its preferred embodiment with a certain degree of particularity, is only illustrative of the principles of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of programming a flash EEPROM cell having first and second floating gates horizontally adjacent to each other and electrically separated from a silicon substrate by a tunnel oxide film, a dielectric film formed over said first and second floating gates, a control gate formed on said dielectric film; source and drain regions formed in said silicon substrate, and regions being partially overlapped with said first and second floating gates, respectively, said method comprising the steps of:

applying bias voltage to said control gate and said source and drain regions so that hot electrons are infected into said first and second floating gates;

selectively discharging said hot electrons infected into said first and second floating gates depending on a condition of the bias voltage applied to said control gate and said source and drain regions, so that 4 numeration information is programmed into said flash EEPROM cell, by:

using said bias voltage which is higher than that applied to said drain and a ground potential is applied to said source to inject hot electrons into said first and second floating gates;

applying a ground potential to said control gate to discharge the hot electrons into said second floating gate and floating said source region and applying said drain region with higher voltage than that applied to said control gate; and applying a ground potential to said control gate to discharge the hot electrons injected into said first and second floating gates and applying a voltage higher than that applied to said control gate to said source and drain regions.

2. A method of reading a flash EEPROM cell having first and second floating gates horizontally adjacent to each other and electrically separated from a silicon substrate by a tunnel oxide film, a dielectric film formed over said first and second floating gates, a control gate formed on said dielectric film, a source and drain regions formed in said silicon substrate, said regions being partially overlapped with said first and second floating gates respectively, said method comprising the steps of:

applying a forward bias voltage between said source and drain regions with a constant voltage being applied to said control gate;

applying a reverse bias voltage between said source and drain regions under a constant voltage applied to said control gate;

applying a reverse bias voltage between said source and drain regions under a constant voltage applied to said control gate;

reading out 4 numeration formation programmed by hot electrons injected selectively into said first and second floating gates depending upon existence of drain and source current;

at the time of applying forward bias voltage, said source region is applied with the ground potential, applying a higher voltage than that applied to said drain region to said control gate; and at a time of applying reverse bias voltage, applying the ground potential to said drain region and applying a higher voltage than that applied to said source region to said control gate.

* * * * *